(12) United States Patent
Strom et al.

(10) Patent No.: US 12,308,847 B2
(45) Date of Patent: May 20, 2025

(54) DUAL LOOP CHARGE PUMP FOR ENHANCED RELIABILITY AND POWER CONSUMPTION

(71) Applicant: International Business Machines Corporation, Armonk, NY (US)

(72) Inventors: James Strom, Rochester, MN (US); John Borkenhagen, Rochester, MN (US); Ann Chen Wu, Hopewell Junction, NY (US); Rashmi Bindu, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 93 days.

(21) Appl. No.: 18/338,492

(22) Filed: Jun. 21, 2023

(65) Prior Publication Data

US 2024/0429924 A1    Dec. 26, 2024

(51) Int. Cl.
*H03L 7/089* (2006.01)
*H03L 7/087* (2006.01)
*H03L 7/099* (2006.01)

(52) U.S. Cl.
CPC ............ *H03L 7/0895* (2013.01); *H03L 7/087* (2013.01); *H03L 7/099* (2013.01)

(58) Field of Classification Search
CPC ........ H03L 7/0895; H03L 7/087; H03L 7/099
See application file for complete search history.

(56) References Cited

U.S. PATENT DOCUMENTS

| 3,559,193 | A | 1/1971 | Savaglio et al. |
|---|---|---|---|
| 4,633,222 | A | 12/1986 | Dingwall |
| 5,939,904 | A | 8/1999 | Fetterman et al. |
| 8,508,265 | B2 | 8/2013 | Yun |
| 9,496,880 | B1 | 11/2016 | Yin et al. |
| 9,654,115 | B2 | 5/2017 | Zhang et al. |
| 10,361,707 | B2* | 7/2019 | Strom ............... H03L 7/093 |
| 10,483,845 | B2 | 11/2019 | Hsueh et al. |
| 11,088,696 | B2 | 8/2021 | Finocchiaro et al. |
| 2005/0162200 | A1* | 7/2005 | Haerle ............. H03L 7/0895 327/157 |
| 2011/0199152 | A1* | 8/2011 | Swei ............... H03L 7/0895 327/538 |

(Continued)

FOREIGN PATENT DOCUMENTS

CN    215072151 U    12/2021
CN    114938134 A    8/2022

(Continued)

OTHER PUBLICATIONS

Da Dalt, Nicola & Sandner, Christoph. (2002). A sub-psec jitter PLL for clock generation in 0.12μm digital CMOS. 415-418.

*Primary Examiner* — Sibin Chen

(74) *Attorney, Agent, or Firm* — Patterson + Sheridan, LLP

(57) ABSTRACT

Embodiments of the present disclosure provide an enhanced phase-locked loop (PLL) circuit and an enhanced charge pump circuit used for various applications, including high-speed data clock generation for complex integrated circuit (IC) designs. The disclosed PLL circuit and charge pump circuit enable significant power and supply current reduction, improved circuit reliability; reduced self-heating and electro-migration risk, and enable use of lower power operational amplifiers with the operational amplifiers driving high impedance nodes.

18 Claims, 5 Drawing Sheets

(56) References Cited

U.S. PATENT DOCUMENTS

| | | |
|---|---|---|
| 2012/0146692 A1 | 6/2012 | Yun |
| 2014/0002152 A1* | 1/2014 | Terrovitis .............. H03L 7/0893 |
| | | 327/536 |
| 2017/0077933 A1 | 3/2017 | Zhang et al. |
| 2019/0199207 A1 | 6/2019 | Hsueh et al. |
| 2021/0203329 A1 | 7/2021 | Finocchiaro et al. |
| 2022/0197321 A1 | 6/2022 | Tiagaraj et al. |
| 2022/0246599 A1* | 8/2022 | Chang ................. H01L 29/0673 |

FOREIGN PATENT DOCUMENTS

| | | |
|---|---|---|
| EP | 3959816 A1 | 3/2022 |
| JP | 5934759 B2 | 6/2016 |
| WO | 2019078993 A1 | 4/2019 |

\* cited by examiner

DUAL LOOP CHARGE PUMP FOR ENHANCED RELIABILITY AND POWER CONSUMPTION

BACKGROUND

The present invention relates to digital data processing, and more specifically, to a phase-locked loop (PLL) circuit and an enhanced charge pump circuit for integrated circuit (IC) designs.

Many PLL circuits and charge pump circuits are used to generate data clocks for high-speed data communications in complex integrated circuit (IC) or IC chip designs of complex electronic systems, such as computer and memory systems. Typically, a processor includes, for example, 40 or more PLL circuits to generate data rate clocks for different Transmit/Receive (TX/RX) interface circuit pairs to support various different protocols and interface standards. Data rate clocks for many IC designs are now greater than 100 Gigabits/Second (GBS) and is expected to continue to increase with new designs. PLL circuits and charge pumps must support high-speed clock generation, providing effective performance and high reliability. A charge pump circuit and the PLL circuit typically incorporate both analog and digital functions. Many existing PLL circuits include complex analog circuitry, and typically use a power supply with a higher voltage domain than other components, use significant power supply current, and consume significant power. For example, some existing charge pump circuits include two sense operational amplifiers with a push-pull output stage of the two sense operational amplifiers driven by a common mode (CM) operational amplifier. Such existing charge pumps consume significant power by both sense operational amplifiers and the push-pull output stage. Lower power consumption is becoming increasingly more important for IC designs as systems move to smaller IC technologies; for example, five (5) nm and lower IC technologies, and electro-migration reduction and reliability are becoming increasingly difficult to achieve. New techniques are needed to implement an enhanced charge pump circuit and enhanced PLL circuits to provide effective and efficient operation while enabling reduced power consumption, enhanced reliability, and reduced electro-migration issues for use for various different applications, particularly for high-speed data communication clock generation.

SUMMARY

Embodiments of the present disclosure are directed to an enhanced phase-locked loop (PLL) circuit and an enhanced charge pump circuit used for various applications, including high-speed data clock generation in complex integrated circuit (IC) designs.

A disclosed charge pump circuit comprises an H-bridge circuit. The H-bridge circuit includes an input coupled to a phase frequency detector to receive respective increment and decrement control signals from the phase frequency detector and an output coupled to a loop filter to control current flow to and from the loop filter based on the respective increment and decrement control signals. The charge pump comprises a first loop control coupled to the H-bridge circuit to drive a pair of current mirror H-bridge footer transistors to provide a charge pump current to match voltages at a first charge pump node and a second charge pump node (e.g., a first sense node and a second charge pump filter node of the H-bridge circuit). The charge pump comprises a second loop control coupled to the H-bridge circuit to drive an H-bridge header transistor to maintain a common mode voltage at the second charge pump node and a third charge pump node (e.g., a second charge pump filter node and a third charge pump filter node of the H-bridge circuit). The second charge pump node and the third charge pump node are coupled to the loop filter.

In a disclosed embodiment, a PLL circuit comprises a voltage controlled oscillator (VCO) circuit having a VCO output frequency controlled by an input voltage. A feedback divider divides the VCO output frequency to a feedback clock frequency, which equals a reference (REF) clock frequency when the PLL circuit reaches a locked state. A phase frequency detector coupled to the feedback divider compares the REF clock frequency and feedback clock frequency FB clock and applies respective increment and decrement control signals coupled to a charge pump circuit. The charge pump circuit comprises an input coupled to the phase frequency detector to receive respective increment and decrement control signals from the phase frequency detector, and an output coupled to a loop filter to control current flow to and from the loop filter based on the respective increment and decrement control signals. The charge pump comprises a first loop control coupled to the H-bridge circuit to drive a pair of current mirror H-bridge footer transistors to provide a charge pump current to match voltages at a first charge pump node and a second charge pump node (e.g., sense node SENSEN and charge pump node FILTN). The charge pump comprises a second loop control coupled to the H-bridge circuit to drive a charge pump header transistor to maintain a common mode voltage at the second charge pump node and a third charge pump node (e.g., charge pump node FILTN and charge pump node FILT of the H-bridge circuit coupled to loop filter). The loop filter provides the control input voltage to the VCO circuit.

The disclosed PLL circuit and charge pump circuit enable significant power and supply current reduction over conventional designs. The current reduction of the disclosed charge pump circuit improves circuit reliability; reduces self-heating and the electro-migration risk, and enables use of lower power operational amplifiers with the operational amplifiers driving high impedance nodes.

DETAILED DESCRIPTION

Figure 1:
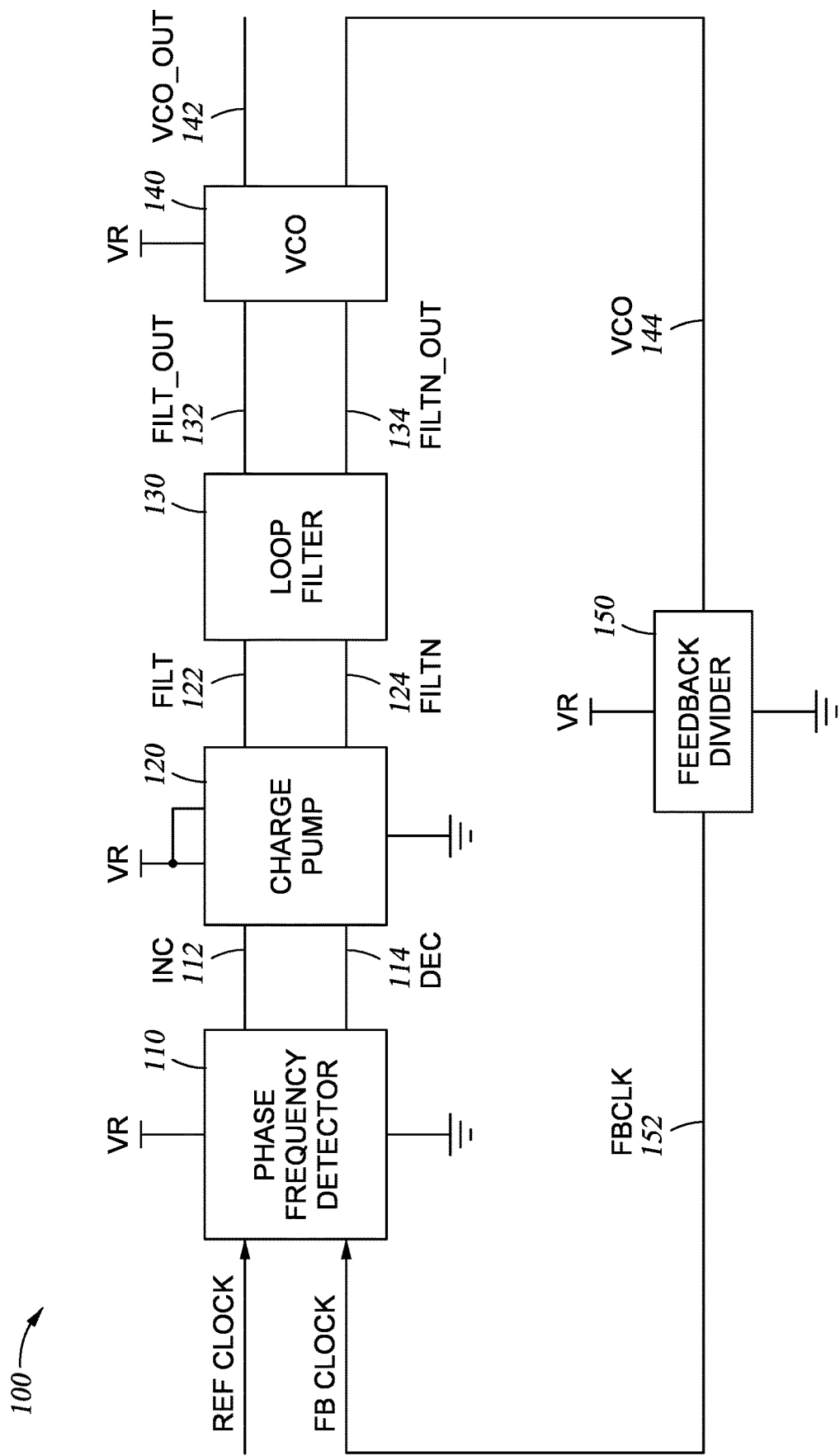
FIG. 1 is a schematic and block diagram illustrating PLL circuit one or more disclosed embodiments.

Embodiments of the present disclosure provide a phase-locked loop (PLL) circuit and charge pump circuit, which enable effective and efficient operation and reduced power consumption, enhanced reliability, and reduced electro-migration issues. A disclosed charge pump circuit and PLL circuit can be used for various applications, such as for use in high-speed clock generation applications. In a disclosed embodiment, a dual loop charge pump circuit uses only two (2) operational amplifiers, providing significant current reduction over conventional designs. The current reduction enabled by the dual loop charge pump circuit improves the reliability of the PLL, for example by reducing self-heating and electro-migration risk, and enables lower power operational amplifiers to be used in charge pump circuit with the operational amplifiers driving only high impedance nodes. In a disclosed embodiment, the charge pump circuit comprises an H-bridge circuit and a dual loop control coupled to the H-bridge circuit. The H-bridge circuit includes an input coupled to a phase frequency detector and an output coupled to a loop filter. In one embodiment, the H-bridge circuit comprises a plurality of switching transistors configured to receive respective increment (INC) and decrement (DEC) control signals from the phase frequency detector and control current flow from and to the loop filter responsive to the respective received INC and DEC control signals to charge, or alternatively to discharge at least one capacitor of the loop filter.

In one embodiment, the charge pump comprises a first sense loop control that drives a pair of H-bridge footer transistors to provide pull down current of the H-bridge circuit, which is the charge pump current to the loop filter, to match respective voltages at first and second charge pump nodes. The charge pump comprises a second common mode loop control, the second common mode loop control drives a header transistor to maintain a common mode voltage at the second charge pump node and a third charge pump node, for example the common mode voltage is equal to approximately one-half voltage of a power supply voltage VR of the charge pump. The second and third charge pump nodes are coupled to the respective inputs of the loop filter.

In a disclosed embodiment, the first sense loop control includes a sense operational amplifier having a respective input coupled to the first node and the second node of the H-bridge circuit. An output of the sense operational amplifier drives the pair of footer transistors to control pull down current of the H-bridge circuit. The second common mode loop control includes a common mode (CM) operational amplifier. The CM operational amplifier has a first input coupled to charge pump sense nodes of the H-bridge circuit and a second input coupled to a common mode voltage for example equal to approximately one-half of a power supply voltage VR of the charge pump. The second common mode loop control drives a header transistor at an output f of the CM operational amplifier to provide a current to set and maintain the common mode voltage at charge pump filter nodes.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Embodiments of the present disclosure are directed to an enhanced charge pump circuit and PLL circuit. The enhanced charge pump circuit and PLL circuit of one or more disclosed embodiments provide significantly reduced power and supply current over conventional designs. The current reduction provided by the charge pump circuit enables improved circuit reliability; reduces self-heating and the electro-migration risk, and enables use of lower power operational amplifiers with the operational amplifiers driving high impedance nodes.

FIG. 1 illustrates a PLL circuit 100 of one or more disclosed embodiments. The PLL circuit 100 includes a phase frequency detector 110 providing a respective increment (INC) signal 112 and a decrement (DEC) control signal 114 to a charge pump 120 of a disclosed embodiment. The disclosed charge pump circuit 120 is coupled to a loop filter 130 at respective outputs FILT 122 and FILTN 124 and controls current flow to the loop filter 130. The disclosed charge pump circuit 120 controls current flow to and from the loop filter 130 to charge, or alternatively to discharge, at least one capacitor of the loop filter 130 responsive to the respective received INC and DEC control signals from the phase frequency detector 110. The loop filter 130 is coupled to a voltage controlled oscillator (VCO) 140 and provides respective outputs FILT_OUT 132 and FILTN_OUT 134 to the VCO 140. The VCO circuit 140 provides a VCO output frequency controlled by an input voltage received at the input nodes FILT_OUT 132 and FILTN_OUT 134. The VCO output frequency indicated at line VCO_OUT 142 provides a data rate clock for high-speed data communications in various complex IC chip designs for electronic systems, such as computer systems, memory systems, and the like.

A feedback divider 150 divides the VCO output frequency VCO_OUT 142, separately indicated at line VCO 144, to provide a feedback clock frequency FBCLK 152. The feedback clock frequency FBCLK 152 is applied to the phase frequency detector 110 indicated at input line FB CLOCK. A reference (REF) clock frequency is applied to the phase frequency detector 110 indicated at input line REF CLOCK. The phase frequency detector 110 compares the feedback clock frequency FB CLOCK and the reference clock frequency REF CLOCK and outputs INC (increment) or DEC (decrement) control signals to the charge pump circuit 120. The feedback clock frequency FB CLOCK should equal the reference clock frequency REF CLOCK when the PLL circuit 100 is locked (i.e., when the PLL circuit 100 reaches a locked state). For example, the phase frequency detector 110 provides an INC control signal to the charge pump circuit 120 when the feedback clock frequency FB CLOCK is a lower frequency than the reference clock frequency REF CLOCK. Alternatively, for example, the phase frequency detector 110 provides a DEC control signal to the charge pump circuit 120 when the feedback clock frequency FB CLOCK is a higher frequency than the reference clock frequency REF CLOCK. For example, the INC control signal and the DEC control signal applied to the charge pump circuit may be pulses having a variable width based on a detected phase frequency difference between the feedback clock frequency FB CLOCK and the reference clock frequency REF CLOCK.

In a disclosed embodiment, the charge pump circuit 120 includes a single sense operational amplifier and a CM operational amplifier; eliminating both one of two sense operational amplifiers and a push-pull output stage of the two sense operational amplifiers of known conventional charge pump circuits. In a disclosed embodiment, the charge pump circuit 120 enables significant power and supply current reduction for the PLL circuit 100, while enabling effective circuit reliability, reduced self-heating and electromigration risk, and use of lower power operational amplifiers with the operational amplifiers driving high impedance nodes.

In a disclosed embodiment, the charge pump circuit 120 can include a single current reference circuit 202, for example, the charge pump uses a single-ended charge pump reference current source 206. The PLL circuit 100 includes a higher power supply voltage VR than other power supply voltages for IC logic, for example in a range of 1.5 Volts and 1.8 Volts, as opposed to 0.7 Volts. As shown with the phase frequency detector 110, the charge pump 120, the VCO circuit 140, and feedback divider 150 include the power supply voltage VR. The power consumption of the analog PLL circuit 100 is a function of the higher power supply voltage VR.

Figure 2A:
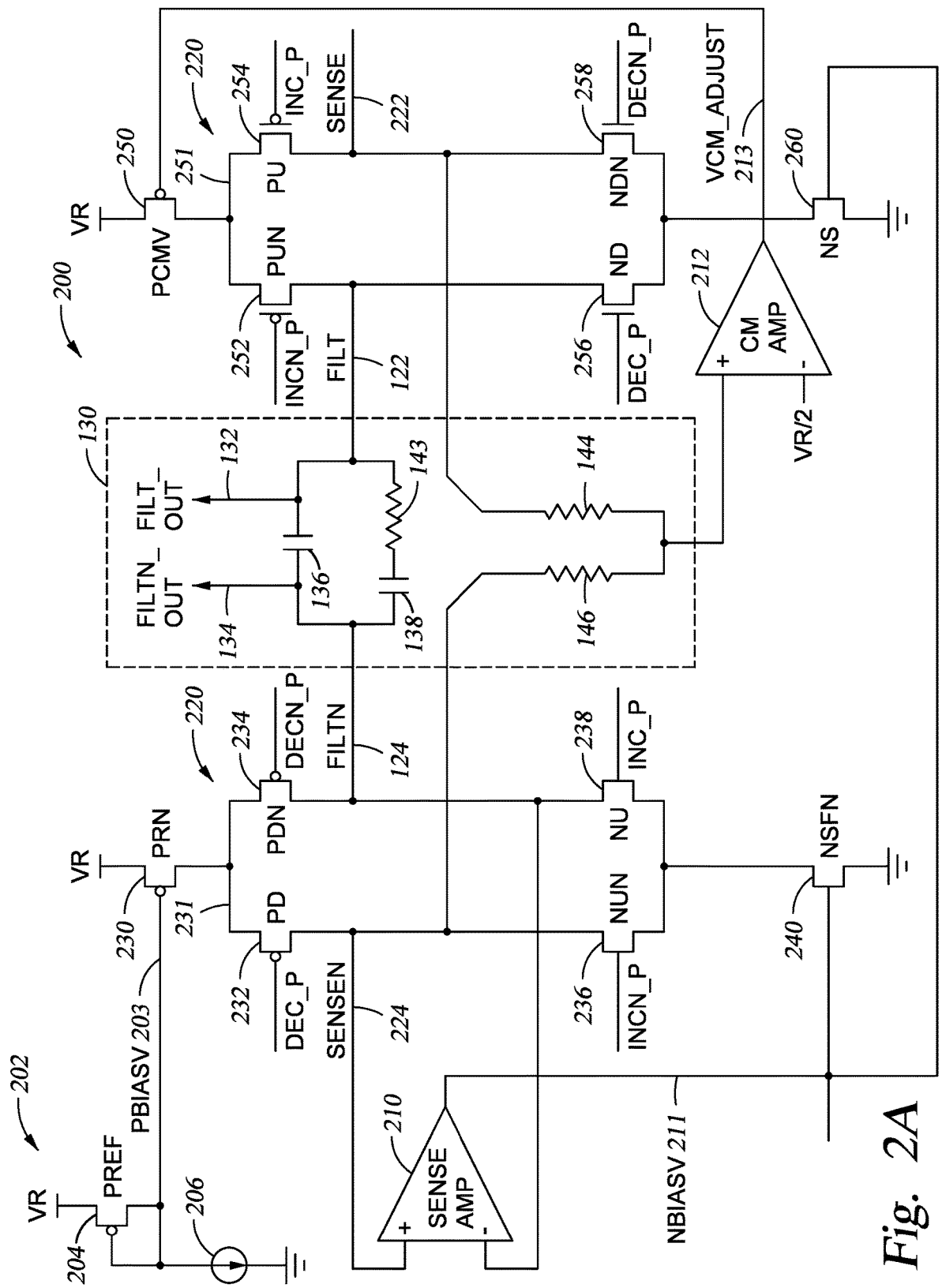
FIGS. 2A and 2B together provide a schematic and block diagram illustrating a dual loop charge pump circuit of the PLL circuit of FIG. 1 one or more disclosed embodiments.
Figure 2B:
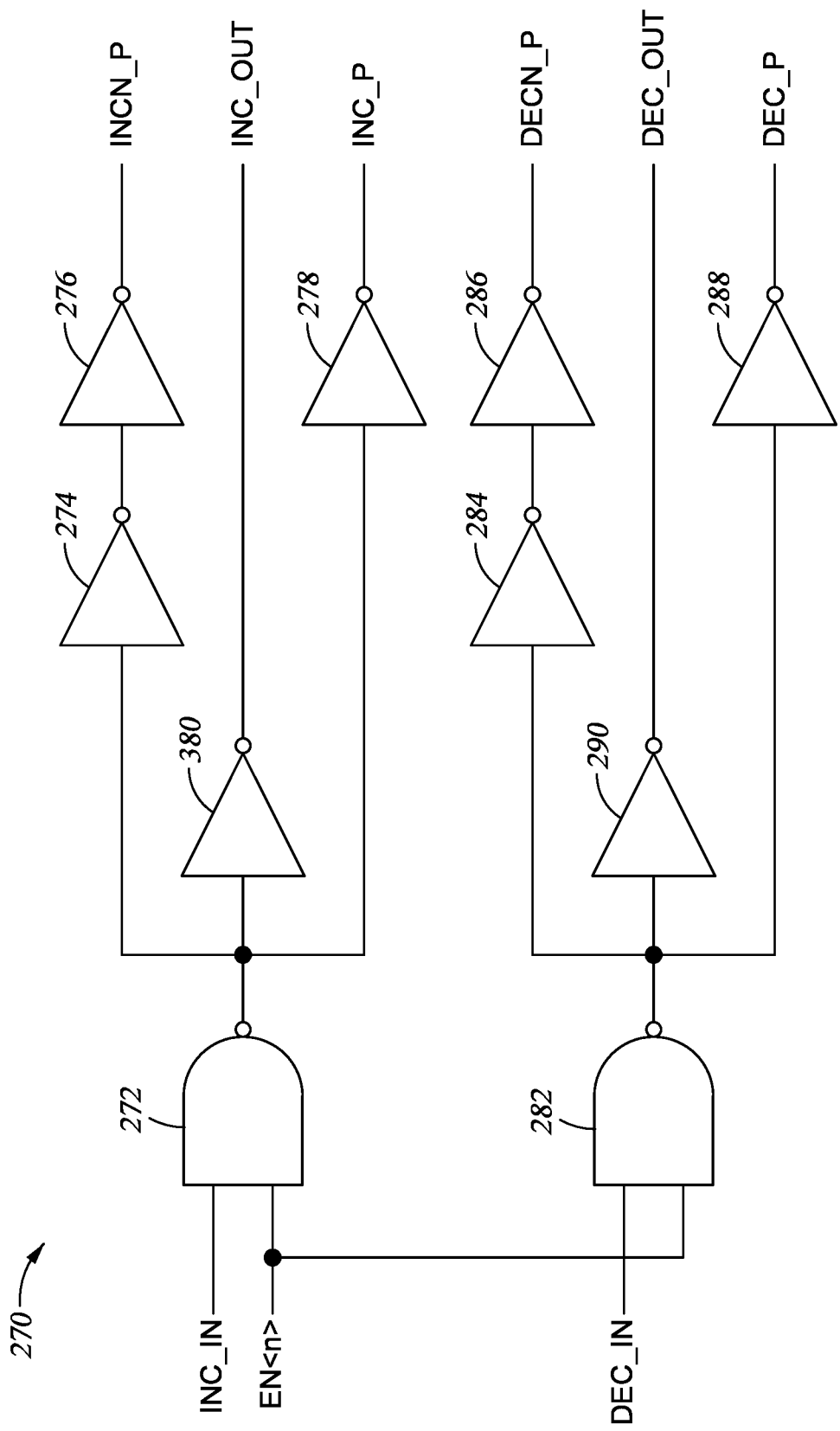

FIGS. 2A and 2B together provide an illustrative example of the charge pump circuit 120 of the PLL circuit 100 of one or more disclosed embodiments. An illustrative example of the loop filter 130 (e.g., indicated by dotted line) is shown with the charge pump circuit 120 in FIG. 2A. For example the illustrative loop filter 130 is a low-pass filter including two capacitors 136, 138 and three resistors 143, 144, 146 as shown in FIG. 2A. It should be understood that various other selected configurations and filtering functions can implement the loop filter 130

Figure 3:
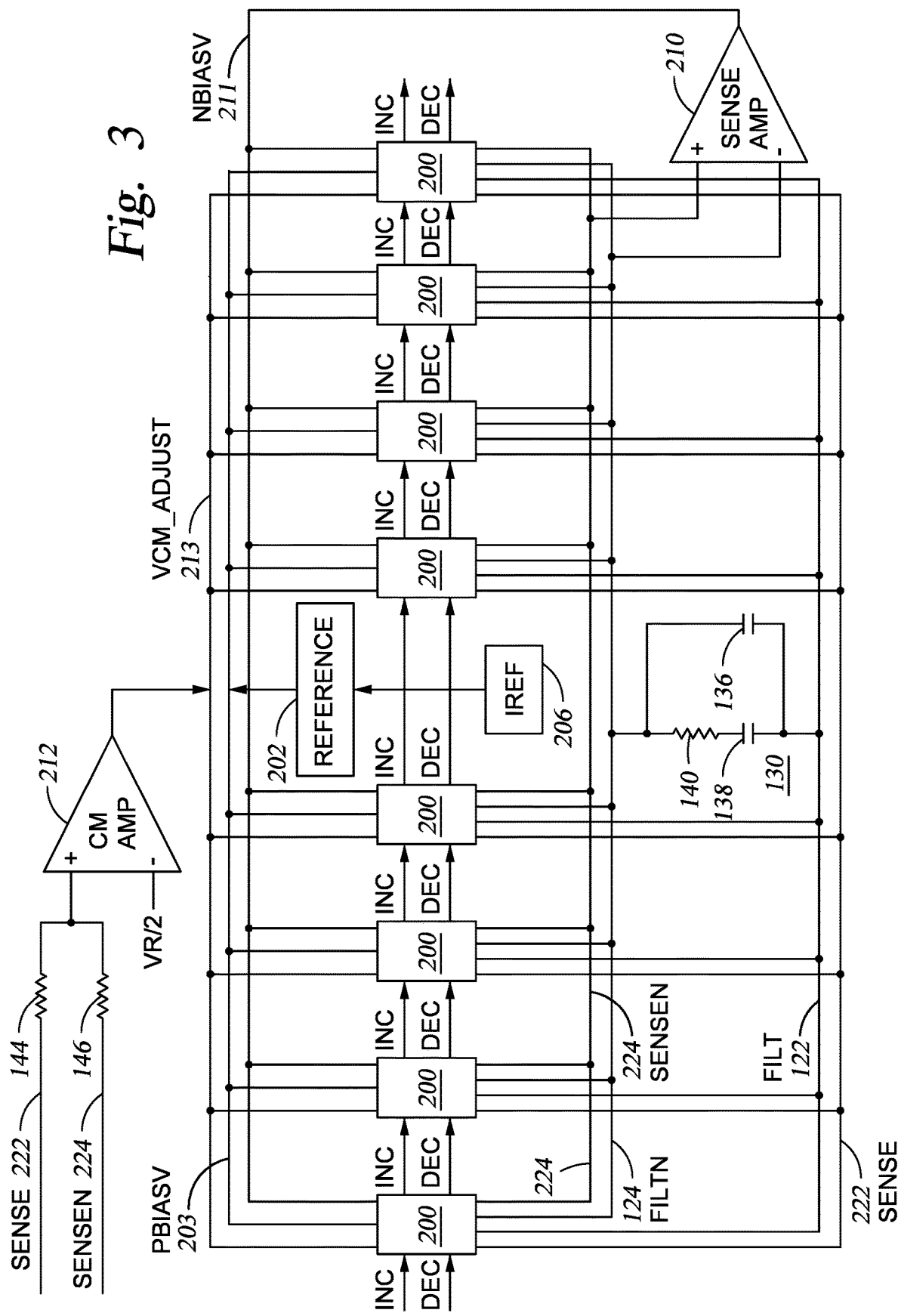
FIG. 3 is a schematic and block diagram illustrating an example multiple slice implementation of the dual loop charge pump circuit of FIGS. 2A and 2B of one or more disclosed embodiments.

A charge pump slice 200 as illustrated in FIGS. 2A and 2B can implement the charge pump circuit 120 including one or more identical charge pump slices 200. For example, multiple identical slices 200 forming the charge pump circuit 120 may be cascaded together with a plurality of charge pump nodes PBIASV 203, NBIASV 211, VCM_ADJUST 213, FILTN 122, FILTN 124, SENSE 222, and SENSEN 224 dotted together as illustrated in FIG. 3. In a disclosed embodiment, the illustrative charge pump 120 includes a single current reference circuit 202 comprising a transistor PREF 204 and a reference current source 206, as shown in FIG. 2A. A common gate and drain connection of PREF 204 and the reference current source 206 of the current reference circuit 202 provides a charge pump node PBIASV 203, as shown.

In a disclosed embodiment, the charge pump circuit 120 comprises an H-bridge circuit 220 and a dual loop control comprising a sense operational amplifier 210 and a common mode (CM) operational amplifier 212 coupled to the H-bridge circuit 220. The H-bridge circuit 220 is coupled to the phase frequency detector 110 and coupled to the loop filter 130. The H-bridge circuit 220 comprises a plurality of switching transistors configured to receive control signals based on respective increment (INC) and decrement (DEC) control signals from the phase frequency detector 110 and control current flow from and to the loop filter 130. Responsive to respective INC and DEC control signals, the H-bridge circuit 220 charges, or alternatively discharges, at least one capacitor of the loop filter 130 (e.g., one of capacitors 136, 138 of the illustrated loop filter 130). A plurality of transistors of the H-bridge circuit 220 may be implemented with various transistor types, such as metal-oxide semiconductor field effect transistors (MOSFETs) including p-channel metal-oxide semiconductor field effect transistors (PFETs) and n-channel metal-oxide semiconductor field effect transistors (NFETs). In a disclosed embodiment, the plurality of transistors of H-bridge circuit 220 for example are implemented by 5 nm FinFETs that can provide improved performance and improved electrical characteristics; for example, improved electrostatic control of the channel, faster switching, and higher current density over conventional MOSFETs.

The plurality of switching transistors of the H-bridge circuit 220 comprise transistors PRN 230, PD 232, PDN 234, NUN 236, NU 238, NSFN 240, PCMV 250, PUN 252, PU 254, ND 256, NDN 258, NSFN 260. The H-bridge header transistor PRN 230 is connected between a power supply voltage VR of the charge pump 120 and respective H-bridge switching transistors PD 232, PDN 234, NUN 236, and NU 238, (i.e., on the left side of H-bridge 220). The H-bridge header transistor PCMV 250 is connected between the power supply voltage VR and respective H-bridge switching transistors PUN 252, PU 254, ND 256, and NDN 258 (i.e., on the right side of H-bridge 220).

The charge pump 120 comprises a first loop control coupled to the H-bridge circuit 220 including the sense operational amplifier 210 to drive a pair of current mirror H-bridge footer transistors NSFN 240, and NS 260 to provide a charge pump current to match voltages at a first charge pump node (e.g., first charge pump node SENSEN 122) and a second charge pump node (e.g., second charge pump node FILTN 124 of the H-bridge circuit). The charge pump 120 comprises a second loop control coupled to the H-bridge circuit 220 including the common mode (CM) operational amplifier 212 to drive an H-bridge header transistor PU 254 to maintain a common mode voltage at the second charge pump node FILTN 124 and a third charge pump node FILT 122 of the H-bridge circuit. The first charge pump node SENSEN 224 is coupled to a fourth charge pump node SENSE 222.

As shown on the left side of FIG. 2A, the H-bridge switching transistors PD 232 and NUN 236 are connected in series with the header transistor PRN 230 and footer transistor NSFN 240. A drain connection of the switching transistors PD 232 and NUN 236 at the first charge pump node SENSEN 224 is connected to an input + of the sense operational amplifier 210 and to the fourth charge pump node SENSE 222 via series connected resistors 144, 146. The H-bridge switching transistors PDN 234 and NU 238 are connected in series with the header transistor PRN 230 and footer transistor NSFN 240. A drain connection of the switching transistors PDN 234 and NU 238 is connected the second charge pump node FILTN 224. The switching transistors PD 232 and PDN 234 respectively receive a gate input DEC_P and DECN_P. The switching transistors NUN 236 and NU 238 respectively receive a gate input INCN_P and INC_P.

As shown on the right side of FIG. 2A, the H-bridge switching transistors PUN 252 and ND 256 are connected in series between the header transistor PCMV 250 and footer transistor NS 260. A drain connection of the switching transistors PUN 252 and ND 256 is connected charge pump node FILT 122. The H-bridge switching transistors PU 254 and NDN 258 are connected in series between the header transistor PCMV 250 and footer transistor NS 260. A drain connection of the switching transistors PU 254 and NDN 258 is connected the third charge pump node SENSE 222. The switching transistors PUN 252 and PU 254 respectively receive a gate input INCN_P and INC_P. The switching transistors ND 256 and NDN 258 respectively receive a gate input DEC_P and DECN_P.

FIG. 2B illustrates an example gate enable control logic circuit 270 that receives the inputs INC_IN and DEC_IN based on the corresponding INC and DEC control signals of phase frequency detector 110. The gate enable control logic circuit 270 is configured for providing gate drive inputs to the switching transistors of the H-bridge circuit 220, and outputs INC_OUT and DEC_OUT to a next charge pump slice 200 of the multiple charge pump slices, for example as illustrated in FIG. 3. The inputs INC_IN and DEC_IN provide an input to a first NAND gate 272 and a second NAND gate 282. An enable input EN<n> is applied to the second of the first NAND gate 272 and the second NAND gate 282. When the INC_IN is high or logical one and the DEC_IN enable input EN<n> is low, or INC_IN is low and the enable input EN<n> is high, or both INC_IN and the enable input EN<n> are low, an output of the first NAND gate 272 is high. Otherwise, the output of the first NAND gate 272 is low when both INC_IN and enable input EN<n> are high. A pair of series connected inverters 274, 276 coupled to the NAND gate 272 provides a gate drive output INCN_P, which is high when the output of the first NAND gate 272 is high or low when the output of the NAND gate 272 is low. An inverter 278 receives the output of NAND gate 272 and provides a gate drive output INC_P, which is high when the output the first NAND gate 272 is low (i.e., the gate drive output INCN_P is the inverse of gate drive output INC_P). An inverter 280 receives the output of NAND gate 272 and provides an output INC_OUT corresponding to INC_IN, which is applied to the next cascaded charge pump slice 200 as illustrated in FIG. 3.

An output of the second NAND gate 282 is low when the DEC_IN is high and enable input EN<n> are high; and otherwise the output of the second NAND gate 282 is high when the DEC_IN is low. The output of the second NAND gate 282 is applied to pair of series connected inverters 284, 286 which provide a gate drive output DECN_P which is low when DEC_IN is high (e.g., the output of the second NAND gate 282 is low). An inverter 288 coupled to the second NAND gate 282 provides a gate drive output DEC_P which is high when DEC_IN is high (e.g., the output of the second NAND gate 282 is low). The gate drive output DEC_P is low when DEC_IN is low (e.g., the output of the second NAND gate 282 is low). An inverter 290 receives the output of the NAND gate 282 and provides an output DEC_OUT which corresponds to DEC_IN and is applied to the next cascaded charge pump slice 200.

As shown in FIG. 2A, the gate drive output INCN_P is applied to the gate of H-bridge switching transistors NUN 236 and PUN 252. The gate drive output INC_P is applied to the respective gate of H-bridge switching transistors NU 238 and PU 254. The gate drive output DECN_P is applied to the gate of H-bridge switching transistors PDN 234 and NDN 258. The gate drive output DEC_P is applied to the gate of H-bridge switching transistors PD 232 and ND 256.

A dual loop control of the charge pump 120 comprises a first sense loop control and a second common mode loop control. The first sense loop control includes the sense operational amplifier 210 and the current reference circuit 202. The current reference circuit 202 provides PBIASV 203 to the gate of the header transistor PRN 230. The sense operational amplifier 210 has a first input (+) connected to node SENSEN 224 and a second input (−) connected to node FILTN 124. An output NBIASV 211 of the sense operational amplifier 210 drives a pair of pull-down current mirror footer transistors NSFN 240 and NS 260, which provide a pull down reference current of the H-bridge circuit 220. The pull down reference current comprises the charge pump current to the loop filter 130. The output NBIASV 211 of the sense operational amplifier 210 drives the footer transistor NSFN 240 to a current needed to provide matching voltages at charge pump nodes SENSEN 224 and FILTN 124, which is the same current of the header transistor PRN 230, for example approximately 25 micro Amps (uAmps). The current of the footer transistor NS 260 mirrors the current of footer transistor NSFN 240.

The second common mode loop control includes the CM operational amplifier 212, which has a first input (+) connected to a center connection of the charge loop series connected resistors 144, 146, which are connected between the fourth charge pump node SENSE 222 and the first charge pump node SENSEN 224. That is, the first charge pump node SENSEN 224 is connected through the charge loop resistors 144 and 146 to the fourth charge pump node SENSE 222. A second input (−) of the CM operational amplifier 212 is connected to a common mode voltage VR/2, which is equal to approximately one-half of the power supply voltage VR of the charge pump 120. An output of the CM operational amplifier 212 drives the header transistor PCMV 250 to set and maintain the common mode voltage VR/2 at the second charge pump node FILTN 124 and the third charge pump node FILT 122. The third charge pump node FILT 122 and the second charge pump node FILTN 124 and provide the loop filter inputs FILT 122 and FILTN 124, shown in FIG. 1.

In operation, once the dual loop charge pump circuit 120 is settled out, current of the H-bridge transistors PRN 230, NSFN 240, NS 260, PCMV 250, and the H-bridge current are the same as the desired charge pump reference current source 206, which provides the PBIASV 303 gate input of transistor PREF 230.

The respective H-bridge switching transistors PD 232, PDN 234, NUN 236, and NU 238. (i.e., shown on the left side of H-bridge 220) and the respective H-bridge switching transistors PUN 252, PU 254, ND 256, and NDN 258 (i.e., shown on the right side of H-bridge 220) operatively control current flow through nodes FILTN 124 and FILT 122 to charge, or alternatively discharge capacitors 136, 138 of the illustrated loop filter 130. The above-described gate inputs generated by the gate enable control logic circuit 270 of FIG. 2B drive all the respective H-bridge switching transistors for operatively controlling the direction of control current flow from and to the loop filter 130. When the phase frequency detector 110 detects a mismatch of the REF_CLOCK and FB CLOCK, the voltage control input provided by the loop filter 130 to the VCO circuit 140 increases or decreases the VCO output frequency at line VCO_OUT 142, which equals feedback frequency VCO 144.

For example, when the gate drive output DEC_P is high (e.g., applied to the gate of H-bridge switching transistors PD 232 and ND 256, switching transistors PD 232 and ND 256 switch ON and conduct current. When the gate drive output DEC_P is high, the gate drive output DECN_P is low (e.g., applied to the gate of H-bridge switching transistors PDN 234 and NDN 258), the switching transistors PDN 234 and NDN 258 do not conduct current or are OFF. The gate drive output INC_P is low (when DEC_P is high) (e.g., applied to the gate of H-bridge switching transistors NU 238 and PU 254, the bridge switching transistors NU 238 and PU 254 conduct current or are ON. The gate drive output INCN_P is high (e.g., applied to the gate of H-bridge switching transistors NUN 236 and PUN 252, the switching transistors NUN 236 and PUN 252 do not conduct current or are OFF.

In the above example, the H-bridge controls current flow to charge at least one capacitor (e.g., capacitors 136, 138) of the loop filter 130 to increase the VOC output frequency VCO_OUT 142 of the VCO circuit 140. On the left side of H-bridge 220, the series-connected switching transistors PD 232 and NUN 236 connected to node SENSEN are ON, providing a current flow path for filter charging and the series-connected switching transistors PDN 234 and NU 238 connected to node FILTN are OFF. On the right side of H-bridge 220, the series-connected switching transistors PUN 252 and ND 256 connected to node FILT are ON, providing a current flow path for filter charging and the series-connected switching transistors PU 254 and NDN 258 connected to node SENSE are OFF.

Alternatively, for example when the gate drive output INC_P is high, and the gate drive output INCN_P is low, the H-bridge 220 controls current to discharge at least one capacitor of the loop filter 130 and increase the VOC output frequency of the VCO circuit 140. On the left side of H-bridge 220, the series-connected switching transistors PD 232 and NUN 236 connected to node SENSEN are OFF and the series-connected switching transistors PDN 234 and NU 238 connected to node FILTN are ON. On the right side of H-bridge 220, the series-connected switching transistors PUN 252 and ND 256 connected to node FILT are OFF and the series-connected switching transistors PU 254 and NDN 258 connected to node SENSE are ON.

FIG. 3 is a schematic and block diagram illustrating an example implementation of the dual loop charge pump circuit 120 of FIGS. 2A and 2B of one or more disclosed embodiments. As shown, the dual loop charge pump circuit 120 includes multiple identical charge pump slices 200 (e.g., eight charge pump slices 200 as shown). The dual loop charge pump circuit 120 can be formed with various numbers of identical charge pump slices 200 cascaded together. A plurality of charge pump nodes PBIASV 203, NBIASV 211, VCM_ADJUST 213, FILTN 122, FILTN 124, SENSE 222, and SENSEN 224, are connected or dotted together and coupled to each of the multiple identical charge pump slices 200. In a disclosed embodiment, the illustrative charge pump 120 includes the single current reference circuit 202 comprising a transistor PREF 204 and a current source 206, as shown in FIG. 2A. A reference current source 206 (IREF) of the current circuit 202 provides the charge pump node PBIASV 203 gate input to the PRN 230 coupled to each of the multiple identical charge pump slices 200, as shown.

In a disclosed embodiment, the charge pump circuit 120 includes the first loop control sense operational amplifier 210 and the second loop control common mode (CM) operational amplifier 212. The first loop control sense operational amplifier 210 provides the charge pump node NBIASV 211 coupled to each of the multiple identical slices 200, as shown. The central connection of resistor 144 (e.g., connected to the fourth charge pump node SENSE 222) and resistor 146 (e.g., connected to H-bridge node SENSEN 224) is coupled to the input (+) of the second loop control CM operational amplifier 212 and common mode reference voltage VR/2 is coupled to the input (−) of the second loop control CM operational amplifier. As described above the second loop control CM operational amplifier 210 provides the charge pump common mode voltage at node VCM_AD-JUST coupled to each of the multiple identical charge pump slices 200, as shown. Each of the charge pump nodes including the first charge pump node SENSEN 224, the second charge pump node FILTN 124, the third charge pump node FILT 122, and the fourth charge pump node SENSE 222 is coupled to the multiple identical slices 200, as shown in FIG. 3.

Figure 4:
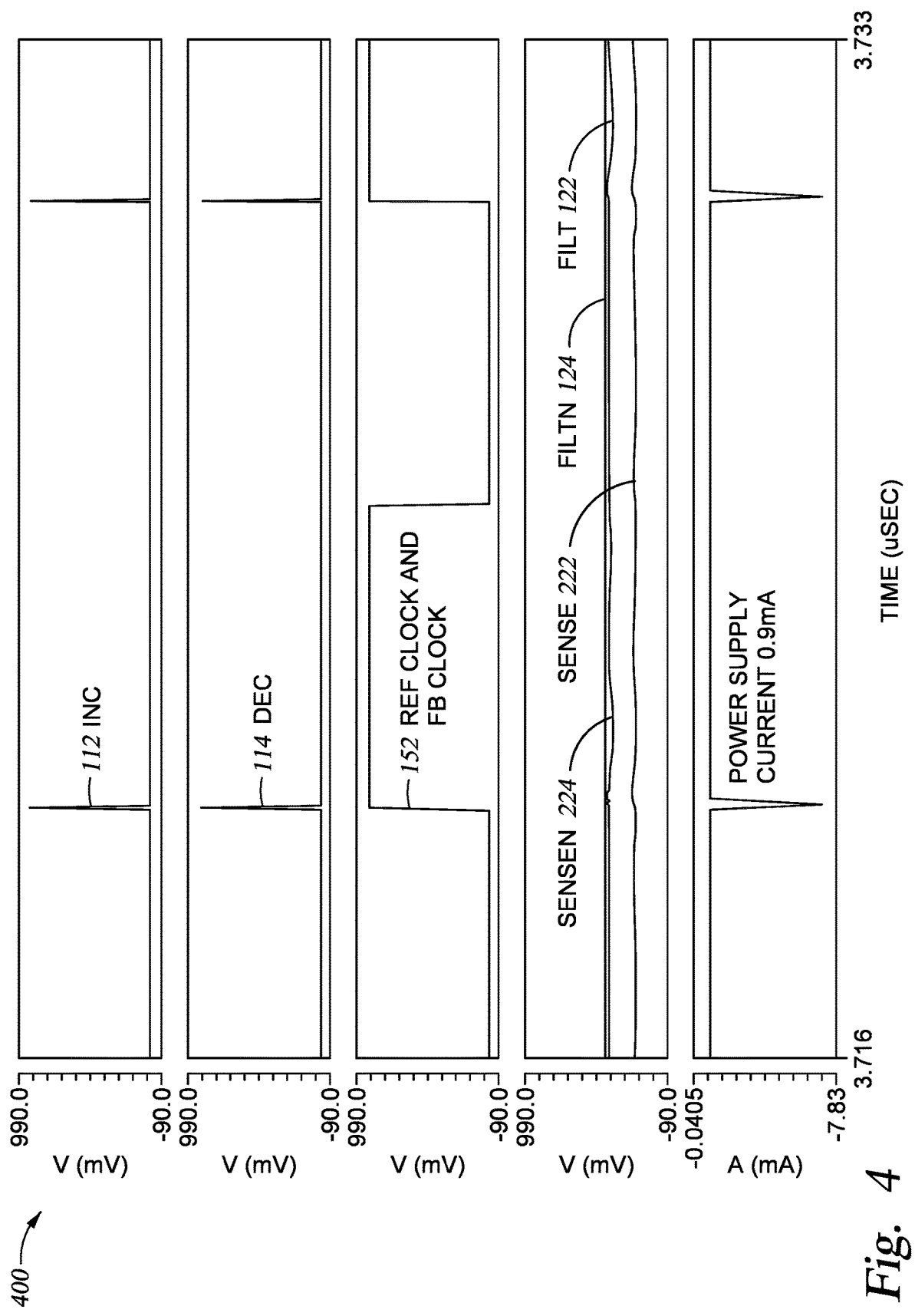
FIG. 4 is a chart providing example illustrative voltage and current waveforms of the dual loop charge pump circuit of FIGS. 2A and 2 of one or more disclosed embodiments.

FIG. 4 is a chart providing example illustrative voltage and current waveform simulations 400, for example of the dual loop charge pump circuit 120 of FIGS. 2A and 2B of one or more disclosed embodiments. Example INC 112 and DEC 114 control signals are illustrated by respective voltage pulses. Example voltage waveforms representing clock signals are shown for REF CLOCK and FB CLOCK (e.g., FBCLK 152 from the feedback divider 150). The REF CLOCK and FB CLOCK are applied to the phase frequency detector 110 as shown in the PLL circuit 100 of FIG. 1. Example illustrative voltages are shown for the third charge pump node FILT 122, the second charge pump node FILTN 124, the first charge pump node SENSEN 224, and fourth charge pump node SENSE 222. As shown, the voltages at the first charge pump node SENSEN 224 and the second charge pump node FILTN 124 are approximately equal. As described-above, the matching voltages at nodes FILTN 124 and SENSEN 224 are provided by the first loop control. For example, the output NBIASV 211 of the sense operational amplifier 210 drives the footer transistor NSFN 240 to a current needed to provide matching voltages at the first charge pump node SENSEN 224 and the second charge pump node FILTN 124, which is the same current of the header transistor PRN 230, for example approximately 25 uAmps.

While the foregoing is directed to embodiments of the present invention, other and further embodiments of the invention may be devised without departing from the basic scope thereof, and the scope thereof is determined by the claims that follow.

What is claimed is:

1. A charge pump circuit comprising:
   an H-bridge circuit; an input of the H-bridge circuit coupled to a phase frequency detector to receive respective increment and decrement control signals from the phase frequency detector;
   an output of the H-bridge circuit coupled to a loop filter to control current flow to and from the loop filter based on the respective increment and decrement control signals;
   a first loop control comprising a sense operational amplifier coupled to the H-bridge circuit, wherein the sense operational amplifier provides an output configured to drive a pair of H-bridge footer transistors providing a charge pump current to match respective voltages at a first charge pump node and a second charge pump node; and
   a second loop control coupled to the H-bridge circuit configured to drive an H-bridge header transistor to adjust a common mode voltage at the second charge pump node and a third charge pump node, the second charge pump node and the third charge pump node coupled to the loop filter.

2. The charge pump circuit of claim 1, wherein the sense operational amplifier having a first input and a second input respectively coupled to the first charge pump node and the second charge pump node.

3. The charge pump circuit of claim 1, wherein the second loop control comprises a common mode (CM) operational amplifier, the CM operational amplifier having a first input coupled to the first charge pump node and a fourth charge pump node and a second input coupled to the common mode voltage.

4. The charge pump circuit of claim 1, wherein an output of a common mode (CM) operational amplifier provides an output configured to drive the H-bridge header transistor to maintain the common mode voltage at the second charge pump node and the third charge pump node.

5. The charge pump circuit of claim 1, the output of the H-bridge circuit coupled to the loop filter controls current flow from the loop filter to discharge at least one capacitor of the loop filter based on a high decrement control signal from the phase frequency detector.

6. The charge pump circuit of claim 1, wherein the output of the H-bridge circuit coupled to the loop filter controls current flow to the loop filter to charge at least one capacitor of the loop filter based on a high increment control signal from the phase frequency detector.

7. The charge pump circuit of claim 1, wherein the H-bridge circuit comprises a plurality of switching transistors coupled between a current reference header transistor and a first transistor of the pair of H-bridge footer transistors.

8. The charge pump circuit of claim 1, wherein the H-bridge circuit comprises a plurality of switching transistors coupled between the H-bridge header transistor and a second transistor of the pair of H-bridge footer transistors.

9. The charge pump circuit of claim 1, wherein the H-bridge circuit comprises a gate enable control logic circuit providing gate drive inputs to a plurality switching transistors of the H-bridge circuit, the gate drive inputs based on the respective increment and decrement control signals from the phase frequency detector.

10. The charge pump circuit of claim 1, wherein the H-bridge circuit comprises a plurality of identical charge pump slices cascaded together, the first charge pump node, the second charge pump node, and the third charge pump node connected to each of the charge pump slices.

11. The charge pump circuit of claim 1, wherein the pair of H-bridge footer transistors and the H-bridge header transistor comprise MOS (metal-oxide semiconductor) FinFETs (Fin Field Effect Transistors).

12. The charge pump circuit of claim 1, wherein the second loop control comprises a common mode (CM) operational amplifier and wherein the sense operational amplifier and the CM operational amplifier comprise low power operational amplifiers configured to drive a high impedance charge pump node.

13. The charge pump circuit of claim 1, wherein the first loop control comprises a single current reference circuit.

14. A phase-locked loop (PLL) circuit comprising:
a reference clock signal;
a voltage controlled oscillator (VCO) circuit having a VCO output frequency controlled by a input control voltage;
a feedback divider coupled to the VCO circuit dividing the VCO output frequency to provide a feedback clock signal;
a phase frequency detector coupled to the feedback divider comparing the reference clock signal and the feedback clock signal, the phase frequency detector generating respective increment and decrement control signals based on comparing the reference clock signal and the feedback clock signal;
a charge pump circuit comprising an input coupled to the phase frequency detector to receive the respective increment and decrement control signals and an output coupled to a loop filter to control current flow to charge, or to discharge at least one capacitor of the loop filter based on the respective increment and decrement control signals;
the charge pump circuit comprising a first loop control comprising a sense operational amplifier that provides an output configured to drive a pair of charge pump footer transistors providing a charge pump current to match respective voltages at a first charge pump node and a second charge pump node; and a second loop control configured to drive a charge pump header transistor to adjust a common mode voltage at the second charge pump node and a third charge pump node, the second charge pump node and the third charge pump node coupled to the loop filter; and
the loop filter providing the input control voltage to the VCO circuit.

15. The PLL circuit of claim 14, wherein the charge pump footer transistors and the charge pump header transistor comprise MOS (metal-oxide semiconductor) FinFETs (Fin Field Effect Transistors).

16. The PLL circuit of claim 14, the sense operational amplifier having a first input and a second input respectively coupled to the first charge pump node and the second charge pump node.

17. The PLL circuit of claim 14, wherein the second loop control comprises a common mode (CM) operational amplifier, the CM operational amplifier having a first input coupled to the first charge pump node and a fourth charge pump node, and a second input coupled to the common mode voltage.

18. The PLL circuit of claim 17, wherein the CM operational amplifier provides an output configured to drive the charge pump header transistor to maintain the common mode voltage at the second charge pump node and the third charge pump node.

* * * * *